United States Patent
Liu et al.

(10) Patent No.: US 11,129,313 B2
(45) Date of Patent: Sep. 21, 2021

(54) ELECTROMAGNETIC-WAVE SHIELDING FILM, PREPARATION METHOD, AND USE THEREOF

(71) Applicant: ETERNAL MATERIALS CO., LTD., Kaohsiung (TW)

(72) Inventors: Shu-Hung Liu, Kaohsiung (TW); Chih-Ching Chen, Kaohsiung (TW); Chin-Yi Liao, Kaohsiung (TW)

(73) Assignee: ETERNAL MATERIALS CO., LTD., Kaohsiung (TW)

( * ) Notice: Subject to any disclaimer, the term of this patent is extended or adjusted under 35 U.S.C. 154(b) by 0 days.

(21) Appl. No.: 16/602,515

(22) Filed: Oct. 22, 2019

(65) Prior Publication Data
US 2020/0128704 A1    Apr. 23, 2020

(30) Foreign Application Priority Data
Oct. 22, 2018   (TW) ................................ 107137196

(51) Int. Cl.
*H05K 9/00*    (2006.01)
*H05K 3/46*    (2006.01)
*H05K 1/02*    (2006.01)

(52) U.S. Cl.
CPC ......... *H05K 9/0088* (2013.01); *H05K 1/0218* (2013.01); *H05K 3/4644* (2013.01); *H05K 2201/0715* (2013.01)

(58) Field of Classification Search
CPC .................................................. H05K 9/0088
USPC ........................................................ 174/250
See application file for complete search history.

(56) References Cited

U.S. PATENT DOCUMENTS

| | | |
|---|---|---|
| 2015/0030878 A1 | 1/2015 | Zhi |
| 2015/0194235 A1 | 7/2015 | Kariya et al. |
| 2017/0028676 A1* | 2/2017 | Yasuda ................... B32B 23/04 |
| 2017/0306172 A1* | 10/2017 | Koduma ................... C09C 1/62 |
| 2018/0019038 A1* | 1/2018 | Tsuchiya .................. H01B 1/22 |
| 2020/0029477 A1* | 1/2020 | Soda ...................... H05K 9/0088 |
| 2020/0177181 A1* | 6/2020 | Nishimura ............. H05K 1/162 |

FOREIGN PATENT DOCUMENTS

| | | |
|---|---|---|
| CN | 105555010 A | 5/2016 |
| JP | 2012-231021 A | 11/2012 |
| JP | 2014-067617 A | 4/2014 |

(Continued)

OTHER PUBLICATIONS

Taiwanese Office Action for corresponding Taiwanese Patent Application No. 107137196.

(Continued)

*Primary Examiner* — Stanley Tso
(74) *Attorney, Agent, or Firm* — Ladas & Parry LLP

(57) ABSTRACT

The present disclosure pertains to an electromagnetic-wave shielding film and a preparation method thereof. The electromagnetic-wave shielding film includes a first metal layer, an insulating layer, and a second metal layer. The first metal layer has two opposite surfaces. The insulating layer is disposed on one of the surfaces of the first metal layer. The second metal layer is disposed on the other surface of the first metal layer and contains nano metal particles and an binder. The electromagnetic-wave shielding film can be used in a printed circuit board, and shows a satisfactory electromagnetic wave shielding effect.

8 Claims, 2 Drawing Sheets

(56) References Cited

FOREIGN PATENT DOCUMENTS

| | | |
|---|---|---|
| JP | 2015-523709 A | 8/2015 |
| JP | 2016086120 A | 5/2016 |
| WO | 2017/111158 A1 | 6/2017 |

OTHER PUBLICATIONS

CN 105555010 A—English Abstract.
Machine English translation of JP2016086120 (A).
Taiwan Search Report issued in corresponding Taiwan Patent Application 107137196 dated Nov. 15, 2019.
Office Action issued for counterpart Japanese application JPA 2019-192692 dated Mar. 8, 2021 by the Japan Patent Office (JPO).
English translation of the Office Action.
JP2015523709 (A) _ Abstract of corresponding document _ US2015030878 A1.
WO 2017/111158 A1 _ English Abstract.
JP 2012-231021 A _ English Abstract.
JP 2014-067617 A1 _English Abstract.

\* cited by examiner

ELECTROMAGNETIC-WAVE SHIELDING FILM, PREPARATION METHOD, AND USE THEREOF

BACKGROUND

1. Field of the Invention

The present disclosure relates to an electromagnetic-wave shielding film and a preparation method thereof, and in particular, to an electromagnetic-wave shielding film including at least one metal layer containing nano metal particles and an binder, and a preparation method thereof.

2. Description of the Related Art

New generations of printed circuit board design tend to be light and thin, and require fast and massive signal transmission. This in turn requires greater wiring density, and high-speed and high-frequency signal transmission, leading to more problematic electromagnetic interference (EMI) to signal transmission on the printed circuit board. Thus, the issue of how to effectively reduce electromagnetic interference in order to maintain normal signal transmission on the printed circuit board has become a topic of extensive research.

At present, the way to reduce electromagnetic interference to signal transmission of the printed circuit board is to provide an electromagnetic-wave shielding film on the printed circuit board. The electromagnetic-wave shielding film can block electromagnetic interference and discharge static electricity of the printed circuit board by grounding. The electromagnetic-wave shielding film sequentially includes, from top to bottom, an insulating layer, a metal layer containing a metal, and a conductive layer. The metal layer is mainly formed by vacuum sputtering or vapor deposition. However, in view of the increasing demand for better electromagnetic wave shielding capability, meeting the need for better electromagnetic wave shielding requires increasing the thickness of the metal layer. But if the metal layer is too thick, it is likely to cause the metal layer to break when the electromagnetic-wave shielding film is bonded to the printed circuit board, causing the problem of leakage of the electromagnetic waves. Furthermore, the process of manufacturing a thick metal layer creates potential problems of uneven film thickness and insufficient densification of the metal surface.

In addition to the above-mentioned electromagnetic-wave shielding film using a metal layer, an electromagnetic-wave shielding film using two metal layers may be used to increase the electromagnetic wave shielding capability. Although the electromagnetic-wave shielding film can effectively shield the electromagnetic waves, the adhesion between the two metal layers is not good, and the two metal layers are easily separated from each other, thereby affecting the electromagnetic wave shielding properties.

Furthermore, the development of flexible electronic products presents problems when the electromagnetic-wave shielding film cannot accommodate being folded, as the layers of the electromagnetic-wave shielding film may become detached or the metal layer may become broken, in which case the electromagnetic wave may leak or the electromagnetic-wave shielding film may be poorly grounded.

Therefore, there are ongoing efforts to provide an electromagnetic-wave shielding film which has excellent electromagnetic wave shielding properties and folding endurance.

In view of this, the inventors of the present disclosure have found an electromagnetic-wave shielding film that can solve the above problems. Specifically, the electromagnetic-wave shielding film of the present disclosure has nano metal particles which can effectively block electromagnetic wave interference while exhibiting excellent folding endurance. Furthermore, the nano metal layer can be applied to a substrate by general coating, printing or spraying, and the manufacturing process is relatively simple and cost-effective.

SUMMARY

In order to solve the above problems, the inventors have found after repeated studies that when a second metal layer containing nano metal particles and an binder is disposed on a surface of a first metal layer, the obtained electromagnetic-wave shielding film has better folding endurance and can maintain an excellent electromagnetic wave shielding effect. Accordingly, the first object of the present disclosure is to provide an electromagnetic-wave shielding film which is particularly suitable for a flexible circuit board.

Therefore, the electromagnetic-wave shielding film of the present disclosure includes a first metal layer, an insulating layer, and a second metal layer. The first metal layer has two opposite surfaces. The insulating layer is disposed on one of the surfaces of the first metal layer. The second metal layer is disposed on the other surface of the first metal layer. The second metal layer contains nano metal particles and an binder.

The second object of the present disclosure is to provide a method for preparing an electromagnetic-wave shielding film.

The method for preparing an electromagnetic-wave shielding film of the present disclosure includes: forming a first metal layer on an insulating layer; applying a metal composition containing nano metal particles and an binder onto the first metal layer; and performing a treatment process on the metal composition, such that a second metal layer formed on the first metal layer is obtained, the treatment process being selected from heat treatment, light treatment, or a combination thereof.

The third object of the present disclosure is to provide a printed circuit device.

The printed circuit device of the present disclosure includes a printed circuit board and the electromagnetic-wave shielding film disposed on the printed circuit board.

The effect of the present disclosure is that it can effectively improve folding endurance of the electromagnetic-wave shielding film while obtaining excellent electromagnetic shielding effectiveness.

BRIEF DESCRIPTION OF THE DRAWINGS

Other features and effects of the present disclosure will be apparent from the implementation methods of the drawings, where.

DETAILED DESCRIPTION

Figure 1:
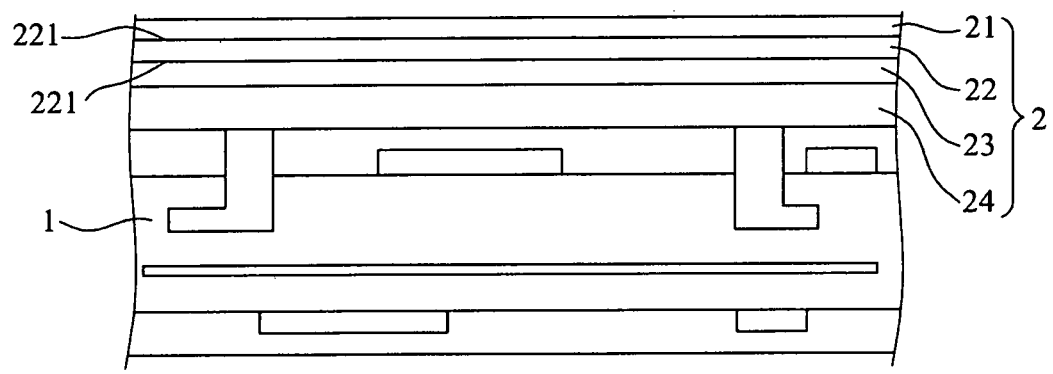
FIG. 1 is a schematic view of an example of a printed circuit device of the present disclosure.

The contents of the present disclosure will be described in detail below.

[Electromagnetic-Wave Shielding Film]

The electromagnetic-wave shielding film of the present disclosure includes a first metal layer, an insulating layer, and a second metal layer. The first metal layer has two opposite surfaces. The insulating layer is disposed on one of the surfaces of the first metal layer. The second metal layer is disposed on the other surface of the first metal layer. The second metal layer contains nano metal particles and an binder.

<Insulating Layer>

The insulating layer can be an insulating layer conventionally applied to an electromagnetic-wave shielding film. The insulating layer has a thickness ranging from 4 μm to 12 μm. The insulating layer is formed of a resin composition. The resin composition includes an epoxy resin 1 and a solvent 1. The epoxy resin 1 may be used alone or in combination of two or more kinds thereof, and the epoxy resin 1 can be, for example, but is not limited to, epoxy resins such as EPICLON® 7050, EPICLON® HP-4700, EPICLON® HP6000, EPICLON® HP-7200 and EPICLON® N-695 manufactured by Dainippon Ink & Chemicals, Inc. (DIC), and epoxy resin such as NPES-903 and NPEL-128E manufactured by Nan Ya Plastics Corporation. The solvent 1 may be used alone or in combination of two or more kinds thereof, and may be, for example, but is not limited to, a polar solvent, a non-polar solvent or the like. The solvent 1 may be, for example, methanol, ethanol, propanol, isopropanol, butanol, tert-butanol, ethylene glycol, ethylene glycol monomethyl ether, ethylene glycol monobutyl ether, ethylene glycol monobutyl ether acetate, diethylene glycol, diethylene glycol monobutyl ether, triethylene glycol monobutyl ether, acetone, butanone, toluene, xylene, ethyl acetate, propyl acetate, butyl acetate, propylene glycol methyl ether or the like. The resin composition further includes carbon black. The carbon black may be, for example, but is not limited to, carbon black such as CN023 manufactured by Eternal Materials Co., Ltd., carbon black such as N375, N550, N660, JE4200, JE4205, JE6300 or JE6305 manufactured by China Synthetic Rubber Corporation, or carbon black such as Ketjenblack® EC-600JD or Ketjenblack® EC-300 manufactured from Ketjenblack of Japan, or the like. The resin composition further includes a polyurethane resin. The polyurethane resin can be used to increase the toughness of the insulating layer. The polyurethane resin may be, for example, but is not limited to, a polyurethane resin such as 85222-30-T manufactured by Eternal Materials Co., Ltd.

<First Metal Layer>

To give the electromagnetic-wave shielding film a better electromagnetic wave shielding effect and to give the first metal layer better mechanical properties to reduce the problem of breaking due to stress, preferably, the first metal layer has a thickness ranging from 10 nm to 300 nm, for example, 12 nm, 15 nm, 20 nm, 30 nm, 40 nm, 50 nm, 60 nm, 65 nm, 70 nm, 75 nm, 80 nm, 90 nm, 120 nm, 150 nm, 200 nm, and 250 nm. More preferably, the first metal layer has a thickness ranging from 30 nm to 150 nm. Still more preferably, the first metal layer has a thickness ranging from 40 nm to 100 nm. The metal in the first metal layer may be used alone or in combination of two or more kinds thereof, and the metal may be, for example, but is not limited to, silver, copper, aluminum, chromium, nickel or the like. Preferably, the metal in the first metal layer is copper, aluminum, nickel, or any combination thereof.

<Second Metal Layer>

Conventionally, the metal layer formed by vacuum sputtering or vapor deposition is more densified and the toughness decreases as the thickness increases. The second metal layer of the present disclosure contains nano metal particles and an binder, has better adhesion to the first metal layer, and absorbs externally-applied stress to provide a buffering effect. Therefore, the layers of the electromagnetic-wave shielding film of the present disclosure have better folding endurance and low tendency to detach, and the second metal layer is also not easily broken, and so the electromagnetic-wave shielding film may be applied to a flexible electronic product.

The second metal layer of the present disclosure is formed by applying a metal composition containing nano metal particles and an binder onto the first metal layer, and performing a treatment process on the metal composition.

The metal composition is applied onto the first metal layer by coating, printing, spraying or the like.

To give the electromagnetic-wave shielding film a better electromagnetic wave shielding effect and the second metal layer better mechanical properties to reduce the problem of breaking due to stress, preferably, the second metal layer has a thickness ranging from 100 nm to 1,500 nm. More preferably, the second metal layer has a thickness ranging from 250 nm to 1,000 nm. Still more preferably, the second metal layer has a thickness ranging from 300 nm to 800 nm. According to an embodiment of the present disclosure, the second metal layer has a thickness ranging from 400 nm to 600 nm.

The poor adhesion of a conventionally-used dual metal-layer electromagnetic wave shielding film had a negative impact on the electromagnetic wave shielding effect due to consequent separation of the two metal layers. To give the electromagnetic-wave shielding film a better electromagnetic wave shielding effect and better adhesion between the second metal layer and the first metal layer, preferably, based on 100 wt % of the total content of the nano metal particles and the binder, the total content of the nano metal particles is greater than 80 wt % and less than 100 wt %, for example, 82 wt %, 85 wt %, 88 wt %, 90 wt %, 92 wt %, 93 wt %, 95 wt %, 97 wt % or 99 wt %. When the content of the nano metal particles is too low, the electromagnetic wave shielding effect of the electromagnetic-wave shielding film is not good, and when the content of the nano metal particles is too high, the adhesion between the second metal layer and the first metal layer is not good. More preferably, the total content of the nano metal particles is 87 wt % to 95 wt %. According to an embodiment of the present disclosure, the nano metal particles have a size ranging from 3 nm to 200 nm, for example, 5 nm, 8 nm, 10 nm, 15 nm, 20 nm, 30 nm, 40 nm, 50 nm, 60 nm, 70 nm, 80 nm, 90 nm, 100 nm, 120 nm, 150 nm, 180 nm, or the like. Preferably, the nano metal particles have a size ranging from 20 nm to 150 nm. More preferably, the nano metal particles have a size ranging from 40 nm to 100 nm. The nano metal particles in the second metal layer may be used alone or in combination of two or more kinds thereof, and the nano metal particles may be, for example, but are not limited to, aluminum, copper, nickel, silver, iron, titanium, cobalt, or any combination thereof. To give the electromagnetic-wave shielding film a better shielding effect and mass-productivity, preferably, the nano metal particles in the second metal layer are aluminum, copper, nickel, silver, or any combination thereof. More preferably, the nano metal particles in the second metal layer are copper, silver, or a combination thereof.

The binder may be used alone or in combination, and the binder may be, for example, but is not limited to, polyvinyl alcohol, polyvinylpyrrolidone, polyvinyl butyral, polysiloxane, dihydrazide, acetylphenylhydrazine, phenylhydrazine, oxalyl-p-phenyldihydrazine, polyethylenimine, gum arabic, sodium polyphosphate, sodium lauryl sulfate, sodium lauryl sulfonate, dodecylamine, cetylamine, or the like. Preferably, the binder is polyvinyl alcohol, polyvinylpyrrolidone, polyvinyl butyral, polysiloxane, dihydrazide, acetylphenylhydrazine, phenylhydrazine, oxalyl-p-phenyldihydrazine, polyethylenimine, sodium lauryl sulfate, sodium lauryl sulfonate, or any combination thereof. In order to give the nano metal particles good dispersity and low tendency to aggregate and to enhance the toughness of the second metal layer, more preferably, the binder is polyvinyl alcohol, polyvinylpyrrolidone, polyvinyl butyral, polysiloxane, polyethylenimine, or any combination thereof.

In order to connect to the printed circuit board and form a grounded circuit with the printed circuit board to provide a better electric field blocking effect, the electromagnetic-wave shielding film may optionally include a conductive layer disposed on the second metal layer.

<Conductive Layer>

The conductive layer has a thickness ranging from 8 μm to 20 μm. The conductive layer is formed of a conductive composition. The conductive composition includes an epoxy resin 2, a conductive material, and a solvent 2. The epoxy resin 2 may be used alone or in combination of two or more kinds thereof, and the epoxy resin 2 may be, for example, but is not limited to, epoxy resins such as EPICLON® HM-091, EPICLON® HP-4700, EPICLON® HP6000, EPTCLON® HP-7200 and EPICLON® N-695 manufactured by Dainippon Ink & Chemicals, Inc. (DIC), and epoxy resins such as NPES-903 and NPEL-128E manufactured by Nan Ya Plastics Corporation. The conductive material may be, for example, but is not limited to, silver-copper powder. The silver-copper powder may be, for example, but is not limited to, silver-coated copper powder such as TFM-C05F manufactured by Toyo Aluminum K.K., silver-coated copper powder such as CuAg4 80-200 or CuAg20 CH100/30 manufactured by GGP Metalpowder AG, silver-coated copper powder such as 1110 manufactured by Mitsui Kinzoku Co., Ltd. of Japan, silver-coated copper powder such as Silver Coating Copper (Sphere-shaped, 3.0-4.0 μm) manufactured by Pan Continental chemical Co., Ltd., or silver-coated copper powder such as EM(2 μm) or EK(2 μm) manufactured by DOWA Electronic Materials of Japan. The solvent 2 may be used alone or in combination of two or more kinds thereof, and the solvent 2 may be, for example, but is not limited to, acetone, butanone, toluene, ethyl acetate, butyl acetate, propylene glycol methyl ether or the like. To provide a better adhesion between the conductive layer and the printed circuit board, the conductive composition may optionally includes a polyurethane resin. The polyurethane resin is, as defined above, which for example, but is not limited to, a polyurethane resin such as 85222-30-T manufactured by Eternal Materials Co., Ltd. In the conductive composition, based on 100 wt % of the total content of the conductive material (such as conductive metal powder) and all of the resins, the content of the conductive material ranges from 20 wt % to 60 wt %, for example, 20 wt %, 30 wt %, 40 wt %, 50 wt % or 60 wt %, preferably from 20 wt % to 40 wt %.

According to an embodiment of the present disclosure, in order to improve the adhesion between the second metal layer and the first metal layer and/or the adhesion between the second metal layer and the conductive layer, the second metal layer of the present disclosure may optionally include a coupling agent which, for example, but is not limited to, a silane coupling agent. The silane coupling agent may be used alone or in combination of two or more kinds thereof, and the silane coupling agent may be, for example, but is not limited to, 2-(3,4-epoxycyclohexyl)ethyltrimethoxysilane, (3-epoxypropoxypropyl)trimethoxysilane, (3-epoxypropoxypropyl)methyldiethoxysilane, (3-epoxypropoxypropyl)triethoxysilane, methyltrimethoxysilane, triethoxymethylsilane, or the like.

[Preparation Method for Electromagnetic-Wave Shielding Film]

The method for preparing an electromagnetic-wave shielding film of the present disclosure includes: forming a first metal layer on an insulating layer; applying a metal composition containing nano metal particles and an binder onto the first metal layer; and performing a treatment process on the metal composition, such that a second metal layer formed on the first metal layer is obtained, the treatment process being selected from heat treatment, light treatment, or a combination thereof.

The insulating layer of the present disclosure may be formed on a carrier film by using a resin composition via coating and drying, and the resin composition is as defined above.

The process for forming the first metal layer on the insulating layer can be classified into a dry-type process and a wet-type process. The dry process includes physical vapor deposition (PVD) and chemical vapor deposition (CVD); and the wet process includes electroplating and electroless plating. In an embodiment of the present disclosure, the first metal layer is formed on the insulating layer by physical vapor deposition of metal. The physical vapor deposition is film deposition in a physical way, for example, sputtering, evaporation or the like. The metal may be, for example, but is not limited to, silver, copper, aluminum, chromium, nickel or the like, and may be used alone or in combination of two of more kinds thereof.

The metal composition is applied onto the first metal layer by coating, printing, spraying or the like. The coating may be, for example, a spin coating method, a bar coating method, a microgravure coating method, a slot coating method, a roller coating method, a die coating method or the like. The printing may be, for example, screen printing, relief printing, gravure printing, lithography or the like. Preferably, the printing is screen printing. According to an embodiment of the present disclosure, the coating method adopted is a microgravure coating method or a slot coating method. The metal composition is as defined above, description of which is not repeated below. The metal composition of the present disclosure may further include a solvent 3. Solvent 3 is preferably a solvent having a high boiling point (about 100° C. or more), and examples thereof include an ester solvent, an ether solvent, an ether ester solvent, an alcohol solvent, a hydrocarbon solvent, and the like. The organic solvent suitable for the present disclosure may be selected from the group consisting of propylene glycol monomethyl ether acetate, toluene, diethylene glycol butyl ether acetate, diethylene glycol diethyl ether acetate, terpineol, ethylene glycol phenyl ether and a combination thereof. According to some preferred embodiments of the present disclosure, the solvent 3 is terpineol.

According to an embodiment of the present disclosure, the temperature of the treatment process ranges from 100° C. to 250° C.

According to an embodiment of the present disclosure, the treatment process is heat treatment. Through the heat treatment process, the solvent 3 in the metal composition can be removed and the nano metal particles in the metal composition can be melted with each other to form a dense metal nano-network which provides excellent electromagnetic wave shielding effect and is flexible and not easily to break. At the same time, the adhesive used in the present disclosure can help the nano metal particles to uniformly disperse and improve the toughness of the second metal layer, and can further tightly adhere the second metal layer to the first metal layer to enhance the electromagnetic shielding effectiveness and the folding endurance of the electromagnetic-wave shielding film.

The heat treatment temperature ranges from 100° C. to 250° C., for example, 100° C., 110° C., 120° C., 140° C., 150° C., 160° C., 170° C., 180° C., 190° C., 200° C., 210° C., 220° C., 240° C. or 250° C. More preferably, the heat treatment temperature ranges from 120° C. to 200° C. Preferably, the heat treatment time ranges from 0.5 minute to 30 minutes, for example, 0.5 minute, 1 minute, 2 minutes, 3 minutes, 5 minutes, 6 minutes, 7 minutes, 8 minutes, 9 minutes, 10 minutes, 15 minutes, 20 minutes, 25 minutes or 30 minutes. More preferably, the heat treatment time ranges from 3 to 15 minutes.

According to an embodiment of the present disclosure, preferably, the heat treatment temperature ranges from 120° C. to 200° C., more preferably from 175° C. to 185° C.

According to an embodiment of the present disclosure, the treatment process is light treatment, which can help the nano metal particles to melt rapidly and shorten the reaction time. The light treatment is performed by using a light source. The light source may be used alone or in combination of two or more kinds thereof, and the light source may be, for example, but is not limited to, pulsed light, vacuum ultraviolet light (VUV), infrared light, or the like. Preferably, the light source is infrared light. The infrared light may be, for example, but is not limited to, near infra-red (NIR) light. Preferably, the light treatment time ranges from 0.1 second to 60 seconds, for example, 0.1 second, 0.2 second, 0.5 second, 1 second, 1.5 seconds, 2 seconds, 3 seconds, 5 seconds, 8 seconds, 10 seconds, 20 seconds, 30 seconds, 40 seconds, 50 seconds or 60 seconds. More preferably, the light treatment time ranges from 0.5 second to 10 seconds. Preferably, the irradiation power of the light treatment ranges from 1 kw to 6 kw.

Preferably, the treatment process includes the heat treatment and the light treatment. The heat treatment and the light treatment can be performed simultaneously or separately. The light treatment can be performed before or after the heat treatment. The light treatment can help shorten the heat treatment time and lower the heat treatment temperature. According to an embodiment of the present disclosure, the metal composition may be subjected to the heat treatment, and then the light treatment. Preferably, the time of the heat treatment ranges from 1 minute to 15 minutes, more preferably, from 3 minutes to 10 minutes. The temperature of the heat treatment ranges from 145° C. to 175° C. The light source of the light treatment is near infra-red light. The time of the light treatment ranges from 0.5 second to 5 seconds. The irradiation power of the light treatment ranges from 1 kw to 6 kw.

The electromagnetic-wave shielding film of the present disclosure may further include a conductive layer disposed on the second metal layer. In some embodiments, the method for preparing an electromagnetic-wave shielding film of the present disclosure further includes: applying a conductive composition comprising an epoxy resin 2, a conductive material (such metal powder), a solvent 2, and an optional polyurethane resin on the second metal layer, and then removing the solvent by heating to prepare a conductive layer. The method of applying a conductive composition may be coating, printing, spraying or the like. The method of coating is as defined above. In some embodiments of the present disclosure, the conductive composition is applied onto the second metal layer by coating. The temperature of heating ranges from 80° C. to 150° C., for example, 80° C., 90° C., 100° C., 110° C., 120° C., 130° C., 140° C. or 150° C. More preferably, the temperature of heating ranges from 100° C. to 130° C. Preferably, the time of heating ranges from 0.5 minute to 10 minutes, for example, 0.5 minute, 1 minute, 2 minutes, 3 minutes, 5 minutes, 7 minutes or 9 minute. More preferably, the time of heating ranges from 2 to 5 minutes.

[Printed Circuit Device]

The printed circuit device of the present disclosure includes a printed circuit board and an electromagnetic-wave shielding film disposed on the printed circuit board.

<Electromagnetic-Wave Shielding Film>

The electromagnetic-wave shielding film is as defined above and description of which is not repeated below.

EXAMPLES

In the following description, similar elements are denoted by the same reference numerals.

Example 1

Referring to FIG. 1, a printed circuit device of the present disclosure includes a printed circuit board 1, and an electromagnetic-wave shielding film 2 disposed on the printed circuit board 1. The electromagnetic-wave shielding film 2 includes an insulating layer 21, a first metal layer 22, a second metal layer 23, and a conductive layer 24. The first metal layer 22 has two opposite surfaces 221. The insulating layer 21 is disposed on one of the surfaces 221 of the first metal layer 22. The second metal layer 23 is disposed on the other surface 221 of the first metal layer 22. The conductive layer 24 is disposed between the second metal layer 23 and the printed circuit board 1.

In Example 1, the method for preparing the electromagnetic-wave shielding film 2 includes a step of forming an insulating layer 21, a step of forming a first metal layer 22, a step of forming a second metal layer 23, and a step of forming a conductive layer 24.

In the step of forming an insulating layer 21, a resin composition is coated on a surface of a releasable polyethylene terephthalate film (PET film; model: MG913; Japan TOYOBO Co., Ltd.) by using a wire wound coating rod #7 to form a coating having a thickness of about 35 μm on the polyethylene terephthalate film, and then dried at 120° C. for 5 minutes to form an insulating layer 21 having a thickness of about 8 μm on the polyethylene terephthalate film, thereby forming a first laminated body. The resin composition is prepared by uniformly stirring and mixing 40 parts by weight of an epoxy resin (EPICLON® 7050; Dainippon Ink & Chemicals, Inc.), 9 parts by weight of an epoxy resin (EPICLON® HP-4700; Dainippon Ink & Chemicals, Inc.), 49 parts by weight of a polyurethane resin (85222-30-T; Eternal Materials Co., Ltd., solids content: 26%), 2 parts by weight of carbon black Ketjenblack® EC-600JD; Ketjenblack, Japan), and 220 parts by weight of butanone at room temperature. The solids content is about 20%.

In the step of forming a first metal layer 22, the first laminated body is placed on an evaporation deposition platform of a fully-automatic vacuum deposition machine (Pohsuan Enterprises Co., Ltd.), and aluminum ingots are placed on a target carrier of the fully-automatic vacuum deposition machine. The vacuum degree is controlled at $5\times10^{-3}$ Pa to perform a deposition treatment to form a first metal layer 22 having a thickness of about 60 nm on the insulating layer 21 of the first laminated body, thereby forming a second laminated body. The parameter conditions of the deposition treatment are: a vacuum degree of $5\times10^{-3}$ Pa; a voltage of 15 volts for 21 seconds, and then 21 volts for 28 seconds.

In the step of forming a second metal layer 23, a metal composition is coated on a surface of the first metal layer 22 of the second laminated body by using wire wound coating rod #7 to form a coating having a thickness of about 750 nm on the first metal layer 22; subjected to a first heat treatment in an oven at the temperature of 150° C. for 3 minutes to roughly dry the coating; and then subjected to a light treatment by irradiation with a near-infrared heater (Model: NIR 126-250; MOS Technology, Germany) to form a second metal layer 23 having a thickness of about 250 nm on the first metal layer 22, thereby forming a third laminated body. The parameter conditions of the near-infrared heater are: the power is set at 2.9 KW; the irradiation time is about 1.56 seconds. The metal composition is formed by uniformly stirring and mixing 11 parts by weight of polyvinylpyrrolidone (BASF, Germany), 89 parts by weight of silver particles having a size of 30 to 70 nm (Ag-T09-nP050; Ceramet, Inc.), and 200 parts by weight of terpineol. The solids content is about 33.3%.

In the step of forming a conductive layer 24, a conductive composition is coated on the surface of the second metal layer 23 of the third laminated body by using wire wound coating rod #7 to form a coating having a thickness of about 45 μm on the second metal layer 23, and then, dried at 120° C. for 3 minutes to form a conductive layer 24 having a thickness of about 20 μm on the second metal layer 23, thereby forming a fourth laminated body. The conductive composition is prepared by uniformly stirring and mixing 35 parts by weight of an epoxy resin (EPICLON® HM-091; Dainippon Ink & Chemicals, Inc.), 7 parts by weight of an epoxy resin (EPICLON® HP-4700; Dainippon Ink & Chemicals, Inc.), 41 parts by weight of a polyurethane resin (85222-30-T; Eternal Materials Co., Ltd., solids content: 26%), 25 parts by weight of silver-coated copper powder (TFM-C05F; Toyo Aluminum K.K.), and 150 parts by weight of butanone. The solids content is about 30%.

Example 2 to Example 6 and Comparative Example 7

In Example 2 to Example 6 and Comparative Example 7, the printed circuit device, the electromagnetic-wave shielding film 2, and the method for preparing the electromagnetic-wave shielding film 2 of are similar to those of Example 1, except that the thickness of the first metal layer 22 or the second metal layer 23 is changed as stated in Table 1.

Comparative Example 1

In Comparative Example 1, the printed circuit device, the electromagnetic-wave shielding film 2, and the method for preparing the electromagnetic-wave shielding film 2 are similar to those of Example 1, except for the method for preparing the second metal layer 23 and the resulting second metal layer 23 (see Tables 1 and 2). In Comparative Example 1, the second laminated body is placed on an evaporation deposition platform of a fully-automatic vacuum deposition machine (Pohsuan Enterprises Co., Ltd.), and copper ingots are placed on a target carrier of the fully-automatic vacuum deposition machine. The vacuum degree is controlled at $5\times10^{-3}$ Pa to perform a deposition treatment to form a second metal layer 23 having a thickness of about 125 nm on the first metal layer 22 of the second laminated body, thereby forming the third laminated body. The parameter conditions of the deposition treatment are: a vacuum degree of $6\times10^{-3}$ Pa; a voltage of 15 volts for 25 seconds, and then 21 volts for 33 seconds.

Comparative Example 2 to Comparative Example 4

In Comparative Example 2 to Comparative Example 4, the electromagnetic-wave shielding film and the preparation method thereof are similar to those of Comparative Example 1, except for the method for preparing the second metal layer 23, and the thicknesses of the first metal layer 22 and the second metal layer 23, as stated in Table 2.

Comparative Example 5

A commercially available electromagnetic-wave shielding film, i.e., SF-PC5500 manufactured by TATSUTA, Japan. is used. The electromagnetic-wave shielding film includes a silver metal layer having a thickness of 150 to 200 nm, and the silver metal layer is formed by physical vapor deposition.

Comparative Example 6

In Comparative Example 6, the electromagnetic-wave shielding film and the preparation method thereof are similar to those of Comparative Example 1, except that only the second laminated body is prepared, and that the first metal layer 22 in the second laminated body has a thickness of 200 nm. The parameter conditions of the deposition treatment are: a vacuum degree of $5\times10^{-3}$ Pa; a voltage of 15 volts for 60 seconds, and then 21 volts for 90 seconds.

Comparative Example 8

In Comparative Example 8, the electromagnetic-wave shielding film and the preparation method thereof are similar to those of Comparative Example 1, except that only the second laminated body is prepared, and that the first metal layer 22 in the second laminated body has a thickness of 75 nm. The parameter conditions of the deposition treatment are: a vacuum degree of $5\times10^{-3}$ Pa; a voltage of 15 volts for 32 seconds, and then 21 volts for 40 seconds.

Evaluation Items

Adhesion: The surface of the second metal layer 23 of the third laminated body of Examples 1 to 6, Comparative Examples 1 to 4, and Comparative Example 7 was cut with a JG-1540 series cross hatch cutter. Then, an adhesive tape (Scotch #600; 3M company) was attached to the surface of the second metal layer 23, the adhesive tape was peeled off at 90 degrees, and the number of squares detached from the second metal layer 23 were counted.

Electromagnetic shielding effectiveness: an isolation tester (EM2107A; Electro-Metrics. Inc.) and a vector network analyzer (Spectrum Master™ MS2712E; Anritsu Corporation) were used to measure the electromagnetic shielding effectiveness of the third laminated body of Examples 1 to 6, Comparative Examples 1 to 4 and Comparative Example 7, the electromagnetic-wave shielding film of Comparative Example 5 and the second laminated body of Comparative Example 6 and Comparative Example 8 in accordance with an ASTM D4935-10 standard test method. The frequency of the electromagnetic wave measurement ranged from 30 MHz to 1.5 GHz.

Figure 2:
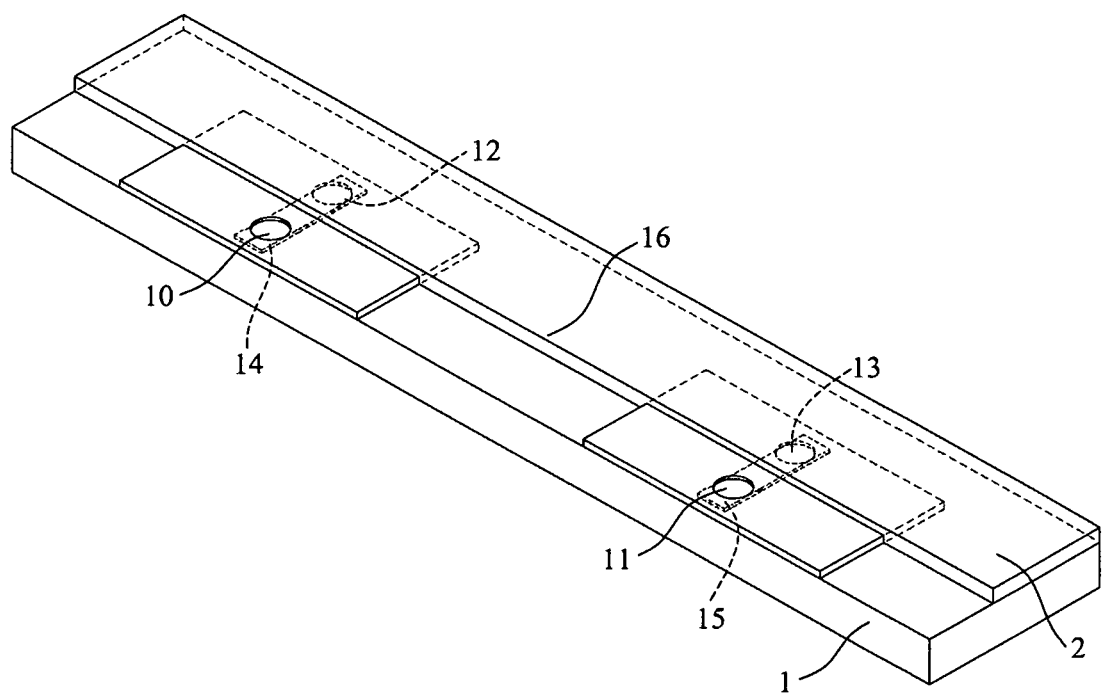
FIG. 2 is a schematic view of a sample to be tested in a folding endurance measurement and an electric resistance measurement of the present disclosure.

Folding endurance and electric resistance (unit: Ω): The electric resistance measurement method was conducted as follows. The conductive layer 24 of the electromagnetic-wave shielding film 2 of Examples 1 to 6, Comparative Examples 1 to 4 and Comparative Example 7, the electromagnetic-wave shielding film of Comparative Example 5 and the first metal layer 22 of the second laminated body of Comparative Example 6 and Comparative Example 8 were attached to openings 12, 13 (the diameter of the openings was 1 mm) of a flexible printed circuit board 1 (FPC) having four openings 10, 11, 12, 13 by hot pressing in accordance with JIS C5016 1994-7.1. The hot pressing conditions were: a pressure of 20 kgf/cm², a temperature of 170° C., and a duration of 300 seconds. Next, an aging treatment was performed at 160° C. for 1 hour to prepare samples to be tested (see FIG. 2). In the samples to be tested, the opening 10 and the opening 12 were electrically connected to a conductive line 14, the opening 11 and the opening 13 were electrically connected to a conductive line 15, and the opening 12 and the opening 13 were electrically connected through the electromagnetic-wave shielding film 2. Two probes of a multimeter were respectively inserted into the opening 10 and the opening 11 to measure the electric resistance (R1). Next, by using an MIT folding endurance tester (HT8636; Hung Ta Instrument Co., Ltd.), the measurement of 20,000 times of folding was performed in the folding region 16 of the sample to be tested in accordance with a JIS P8115 standard test method, and then, the probes of the multimeter were respectively inserted into the opening 10 and the opening 11 again to measure the electric resistance value (R2). After carrying out the folding treatment, if the electric resistance of the sample is greater than 10Ω, it indicates that the first metal layer 22 and the second metal layer 23 of the electromagnetic-wave shielding film 2 were detached from each other or broken, that is, the folding endurance of the sample was not good.

TABLE 1

| Electromagnetic-wave shielding film 2 | | | | Example | | | | | | | Comparative Example |
|---|---|---|---|---|---|---|---|---|---|---|---|
| | | | | 1 | 2 | 3 | 4 | 5 | 6 | | 7 |
| Insulating layer 21 | Coating thickness (μm) | | | | | | 35 | | | | |
| | Drying | Temperature (° C.) | | | | | 120 | | | | |
| | | Time (min) | | | | | 5 | | | | |
| | Thickness of the formed layer (μm) | | | | | | 8 | | | | |
| | Resin composition (Unit: parts by weight) | EPICLON® 7050 | | | | | 40 | | | | |
| | | EPICLON® HP-4700 | | | | | 9 | | | | |
| | | 85222-30-T | | | | | 49 | | | | |
| | | Ketjenblack® EC-600JD | | | | | 2 | | | | |
| | | Butanone | | | | | 220 | | | | |
| | | Solids content (%) | | | | | 20 | | | | |
| First metal layer 22 | Vapor deposition | Deposition thickness (nm) | | 60 | 60 | 60 | 75 | 75 | 75 | | 75 |
| | | Vacuum degree (10⁻³, Pa) | | 5 | 5 | 5 | 5 | 5 | 5 | | 5 |
| | | Voltage (V)/time (sec) | | 15/21 21/28 | 15/21 21/28 | 15/21 21/28 | 15/32 21/40 | 15/32 21/40 | 15/32 21/40 | | 15/32 21/40 |
| | Metal | Type | | | | | Aluminum | | | | |
| | Coating thickness (×10², nm) | | | 7.5 | 13 | 16 | 18 | 18 | 20 | | 60 |
| | Treatment process | Heat treatment [temperature (° C.)/time (mm)] | | | | | 150/3 | | | | |
| | | Light treatment [power (kw)/time (sec)] | | | | | 2.9/1.56 | | | | 2.9/3.0 |
| Second metal layer 23 | Thickness of the formed layer (nm) | | | 250 | 400 | 500 | 500 | 550 | 590 | | 1800 |
| | Metal composition (Unit: parts by weight) | Nano metal particles | Type | | | | Silver | | | | |
| | | | Size (nm) | | | | 30~70 | | | | |
| | | | Content | | | | 89 | | | | |
| | | Binder | Type | | | | Polyvinylpyrrolidone | | | | |
| | | | Content | | | | 11 | | | | |
| | | Terpineol | Content | | | | 200 | | | | |
| | | Solids content (%) | | | | | 33.3 | | | | |
| Conductive layer 24 | Coating thickness (μm) | | | | | | 45 | | | | |
| | Drying | Temperature (° C.) | | | | | 120 | | | | |
| | | Time (min) | | | | | 3 | | | | |
| | Thickness of the formed layer (μm) | | | | | | 20 | | | | |
| | Conductive composition (Unit: parts by weight) | EPICLON® HM-091 | | | | | 35 | | | | |
| | | EPICLON® HP-4700 | | | | | 7 | | | | |
| | | 85222-30-T | | | | | 41 | | | | |
| | | TFM-C05F | | | | | 25 | | | | |
| | | Butanone | | | | | 150 | | | | |
| | | Solids content (%) | | | | | 30 | | | | |

TABLE 2

| Electromagnetic-wave shielding film 2 | | | Comparative Example 1 | 2 | 3 | 4 | 6 | 8 |
|---|---|---|---|---|---|---|---|---|
| Insulating layer 21 | Coating thickness (μm) | | 35 | | | | | |
| | Drying | Temperature (° C.) | 120 | | | | | |
| | | Time (min) | 5 | | | | | |
| | Thickness of the formed layer (μm) | | 8 | | | | | |
| | Resin composition (Unit: parts by weight) | EPICLON ® 7050 | 40 | | | | | |
| | | EPICLON ® HP-4700 | 9 | | | | | |
| | | 85222-30-T | 49 | | | | | |
| | | Ketjenblack ® EC-600JD | 2 | | | | | |
| | | Butanone | 220 | | | | | |
| | | Solids content (%) | 20 | | | | | |
| First metal layer 22 | Deposition thickness (nm) | | 60 | 60 | 60 | 75 | 200 | 75 |
| | Vapor deposition | Vacuum degree (10⁻³, Pa) | 5 | 5 | 5 | 5 | 5 | 5 |
| | | Voltage (V)/time (sec) | 15/21 21/28 | 15/21 21/28 | 15/21 21/28 | 15/32 21/40 | 15/60 21/90 | 15/32 21/40 |
| | Metal | Type | Aluminum | | | | | |
| Second metal layer 23 | Deposition thickness (nm) | | 125 | 40 | 50 | 60 | — | — |
| | Vapor deposition | Vacuum degree (10⁻³, Pa) | 6 | 6 | 6 | 6 | | |
| | | Voltage (V)/time (sec) | 15/25 21/33 | | | | | |
| | Metal | Type | Copper | | | | | |
| Conductive layer 24 | Coating thickness (μm) | | 45 | | | | | |
| | Drying | Temperature (° C.) | 120 | | | | | |
| | | Time (min) | 3 | | | | | |
| | Thickness of the formed layer (μm) | | 20 | | | | | |
| | Conductive composition (Unit: parts by weight) | EPICLON ® HM-091 | 35 | | | | | |
| | | EPICLON ® HP-4700 | 7 | | | | | |
| | | 85222-30-T | 41 | | | | | |
| | | TFM-C05F | 25 | | | | | |
| | | Butanone | 12 | | | | | |
| | | Solids content (%) | 30 | | | | | |

TABLE 3

| Evaluation Items | | Number of squares detached | Electromagnetic shielding effectiveness (dB, 1 GHz) | Number of times of folding (times) | Electric resistance (Ω) Before folding (R1) | After folding (R2) |
|---|---|---|---|---|---|---|
| Example | 1 | 0 | 51 | 20,000 | 1.5 | 2.3 |
| | 2 | 0 | 53 | 20,000 | 1.2 | 2.33 |
| | 3 | 0 | 55 | 20,000 | 0.64 | 2.59 |
| | 4 | 0 | 57 | 20,000 | 0.61 | 2.17 |
| | 5 | 0 | 58 | 20,000 | 0.60 | 2.34 |
| | 6 | 0 | 63 | 20,000 | 0.52 | 1.9 |
| Comparative Example | 1 | 100 | 47 | <10 | 2.0 | Broken, cannot be measured |
| | 2 | 100 | 51 | <10 | 1.5 | Broken, cannot be measured |
| | 3 | 100 | 54 | <10 | 0.7 | Broken, cannot be measured |
| | 4 | 100 | 62 | <10 | 0.52 | Broken, cannot be measured |
| | 5 | — | 53 | 20,000 | 0.76 | 2,300 |
| | 6 | — | 52 | 20,000 | 1.2 | 1,200 |
| | 7 | 0 | 63 | 20,000 | 0.5 | 350 |
| | 8 | — | 44 | 20,000 | 2.5 | 112 |

It can be seen from the experimental data of Table 3 that the first metal layer 22 and the second metal layer 23 of the present disclosure have good adhesion therebetween, provide good electromagnetic wave shielding effect, and maintain low electric resistance even after being folded 20,000 times, which indicates that after the electromagnetic-wave shielding film 2 of the present disclosure is folded 20,000 times, the first metal layer 22 and the second metal layer 23 or the second metal layer 23 and the conductive layer 24 are not detached from each other or become broken, thereby showing excellent folding endurance.

The film in Comparative Examples 1 to 4 has the same first metal layer 22 as the present disclosure but differs from the present disclosure in that the second metal layer 23 does not comprise nano metal particles. As can be seen from the experimental data of Table 3, the adhesion between the first metal layer 22 and the second metal layer 23 is not good, and the metal layers suffer significant breakage after being folded. Comparative Example 5 is a commercially available electromagnetic-wave shielding film including a silver metal layer having a thickness of 150 to 200 nm. Although the electromagnetic shielding effectiveness is 53 dB, after 20,000 times of folding, the electric resistance is as high as 2300Ω, indicating that the detachment between layers or breakage of metal layers has occurred and the folding endurance is not good. In Comparative Example 6, the first metal layer 22 has a thickness of 200 nm, and the second metal layer 23 is absent. The results show that it still cannot pass a fold endurance test.

Comparative Example 7 has the same structure as that of the present disclosure except that the second metal layer 23 has a thickness of as high as 1,800 nm. Although the second metal layer 23 has an excellent electromagnetic shielding effect, the folding endurance is not good, and the thickness of the entire electromagnetic-wave shielding film is too large to meet the current tendency to be light and thin. In Comparative Example 8, the first metal layer 22 has a thickness of 75 nm, and the second metal layer 23 is absent. The electromagnetic shielding effectiveness is only 44 dB, indicating that the electromagnetic wave shielding effect is not good.

In summary, the present disclosure can provide better adhesion between the first metal layer 22 and the second metal layer 23 of the electromagnetic-wave shielding film 2 through the metal nano particles and the binder in the second metal layer 23. By the design of the second metal layer 23, the electromagnetic-wave shielding film 2 has excellent electromagnetic wave shielding effect and folding endurance, so that the objects of the present disclosure can be achieved.

What is described in the foregoing is only an exemplary embodiment of the present invention, and definitely is not intended to limit the scope of the present disclosure; that is, all simple equivalent changes and modifications made according to the claims or the summary of the present disclosure fall within the scope of the present disclosure.

What is claimed is:

1. An electromagnetic-wave shielding film, comprising:
   a first metal layer, having two opposite surfaces, wherein the first metal layer consists essentially of silver, copper, aluminum, or any combination thereof;
   an insulating layer, disposed on one of the surfaces of the first metal layer; and
   a second metal layer, disposed on the other surface of the first metal layer,
   wherein the second metal layer comprises nano metal particles and a binder;
   wherein the binder is present in the second metal layer in an amount effective to enhance adhesion between the first and second metal layers,
   and wherein the nano metal particles in the second metal layer are melted with each other to form a flexible metal nano-network;
   wherein the nano metal particles in the second metal layer are aluminum, copper, silver, or any combination thereof;
   wherein the second metal layer directly contacts the other surface of the first metal layer; and wherein the second metal layer has a thickness ranging from 100 nm to 1,500 nm.

2. The electromagnetic-wave shielding film according to claim 1, wherein the first metal layer has a thickness ranging from 10 nm to 300 nm, and the second metal layer has a thickness ranging from 250 nm to 1,000 nm.

3. The electromagnetic-wave shielding film according to claim 1, wherein the binder in the second metal layer is polyvinyl alcohol, polyvinylpyrrolidone, polyvinyl butyral, polysiloxane, dihydrazide, acetylphenylhydrazine, phenylhydrazine, oxalyl-p-phenyldihydrazine, polyethylenimine, gum arabic, sodium polyphosphate, sodium lauryl sulfate, sodium lauryl sulfonate, dodecylamine, cetylamine, or any combination thereof.

4. The electromagnetic-wave shielding film according to claim 1, wherein in the second metal layer, based on 100 wt % of the total content of the nano metal particles and the binder, the total content of the nano metal particles is greater than 80 wt % and less than 100 wt %.

5. The electromagnetic-wave shielding film according to claim 1, wherein in the second metal layer, the nano metal particles have a size ranging from 3 nm to 200 nm.

6. A method for preparing the electromagnetic-wave shielding film according to claim 1, comprising:
   forming the first metal layer on the insulating layer;
   applying a metal composition comprising the nano metal particles and the binder onto the first metal layer; and
   performing a treatment process on the metal composition, the treatment process being selected from heat treatment, light treatment, or a combination thereof, such that a second metal layer formed on the first metal layer is obtained.

7. The method for preparing an electromagnetic-wave shielding film according to claim 6, wherein the metal composition is applied onto the first metal layer by coating, printing or spraying.

8. A printed circuit device, comprising: a printed circuit board and the electromagnetic-wave shielding film according to claim 1 disposed on the printed circuit board.

\* \* \* \* \*